United States Patent
He et al.

[11] Patent Number: 6,017,786
[45] Date of Patent: Jan. 25, 2000

[54] METHOD FOR FORMING A LOW BARRIER HEIGHT OXIDE LAYER ON A SILICON SUBSTRATE

[75] Inventors: Yuesong He; John Jianshi Wang, both of San Jose; Dae Yeong Joh, Los Altos, all of Calif.

[73] Assignee: Advanced Micro Devices, Inc., Sunnyvale, Calif.

[21] Appl. No.: 08/982,186

[22] Filed: Dec. 17, 1997

[51] Int. Cl.[7] ................................................ H01L 21/316
[52] U.S. Cl. .......................... 438/216; 438/264; 438/762; 438/770; 438/287
[58] Field of Search .................................. 438/770, 769, 438/762, 216, 264, 261, 287

[56] References Cited

U.S. PATENT DOCUMENTS

| | | | |
|---|---|---|---|
| 4,642,881 | 2/1987 | Matsukawa et al. | 29/576 |
| 4,814,291 | 3/1989 | Kim | 437/101 |
| 5,429,966 | 7/1995 | Wu | 437/43 |
| 5,780,342 | 7/1998 | Wang | 438/260 |
| 5,930,658 | 7/1999 | Ibok | 438/482 |
| 5,940,736 | 8/1999 | Brady | 438/787 |

*Primary Examiner*—Charles Bowers
*Assistant Examiner*—Matthew Whipple
*Attorney, Agent, or Firm*—Renner, Otto, Boisselle & Sklar PLL

[57] ABSTRACT

This invention relates to a method for forming a low barrier height oxide layer on the surface of a crystalline silicon substrate, comprising: (A) forming spaced field oxide regions on the surface of said crystalline silicon substrate, the space between said field oxide regions comprising a tunnel region; (B) vapor depositing a layer of amorphous silicon on the surface of said field oxide regions and on the surface of said substrate in said tunnel region, the thickness of said layer of amorphous silicon being in the range of about 50 Å to about 100 Å; and (C) oxidizing said layer of amorphous silicon. The oxidized amorphous silicon layer in said tunnel region is a tunnel oxide layer and, in one embodiment, the inventive method includes the step of (D) forming a floating gate over said tunnel oxide layer, said tunnel oxide layer having a barrier height of about 1.6 to about 2.0 eV.

8 Claims, 1 Drawing Sheet

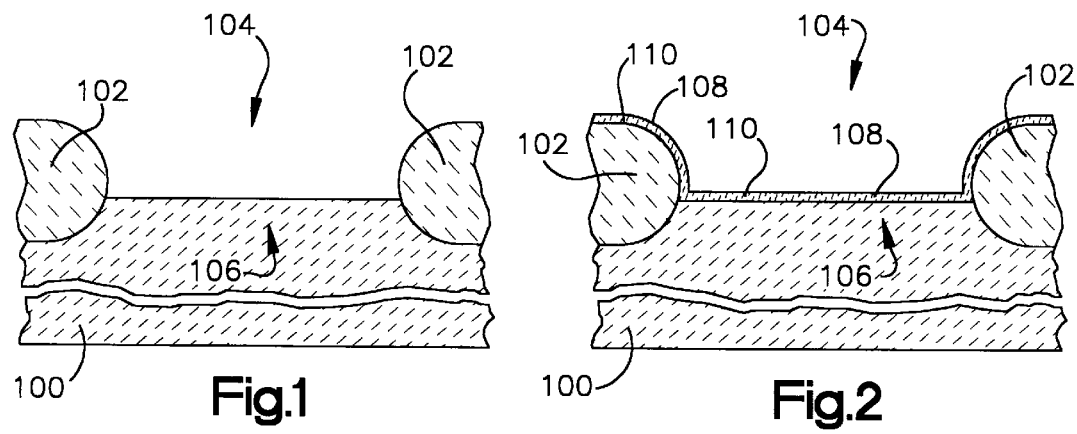
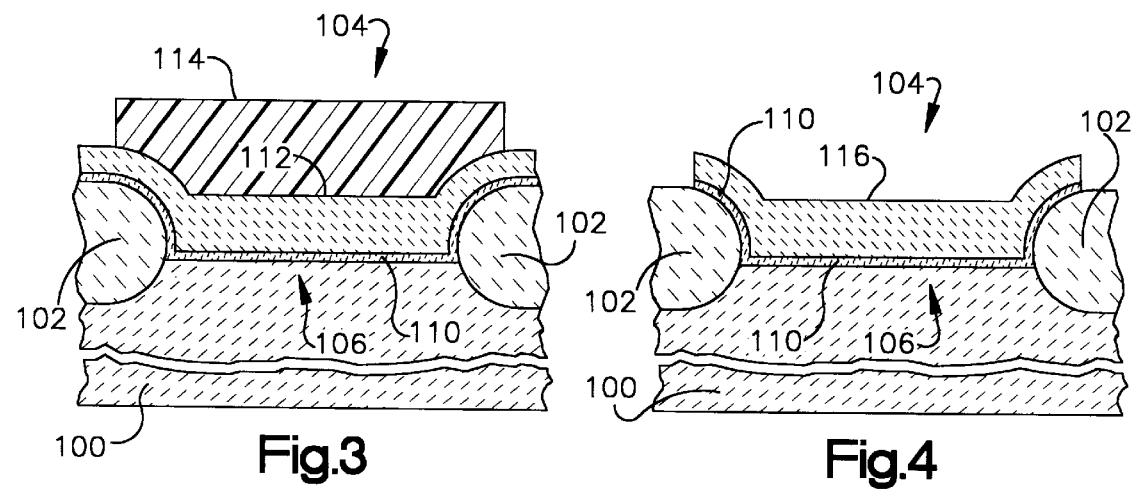

METHOD FOR FORMING A LOW BARRIER HEIGHT OXIDE LAYER ON A SILICON SUBSTRATE

TECHNICAL FIELD

This invention relates to a method for forming a low barrier height oxide layer on a silicon substrate. The method is useful in making non-volatile memory cells with low barrier height tunnel oxides which are useful for low voltage applications.

BACKGROUND OF THE INVENTION

Non-volatile memory cells use the oxide grown on the crystalline silicon substrate as their Fowler-Nordheim tunnel oxide. Electrons tunnel through this oxide into the floating gate where they stay until they are pulled out. This tunnel oxide has a barrier height of 3.2 eV. In order to induce electron tunneling through this barrier height, a relatively high voltage across the tunnel oxide is required. For example, for a 100 Å tunnel oxide, more than 10 volts is required across the tunnel oxide in a typical flash memory application. On the other hand, the barrier height of the oxide grown on an amorphous silicon layer in accordance with the present invention is in the range of about 1.6 to about 2.0 eV, and in one embodiment only about 1.8 eV. Because of this lower barrier height, the electric field strength required to induce the same Fowler-Nordheim tunnel current is smaller. This is useful for low voltage applications.

U.S. Pat. 4,642,881 discloses a method of manufacturing a non-volatile semiconductor memory device having a gate oxide layer including a relatively thin silicon dioxide layer. This gate oxide layer including the thin silicon dioxide layer is formed by the steps of forming the gate oxide film on a semiconductor element region in a silicon substrate; removing a portion of the gate oxide film to expose a portion of the silicon substrate; implanting impurity ions in the exposed portion of the substrate to an extent that a peak concentration of the impurity ions exceeds a solid solution limit at a temperature of the following thermal annealing step; activating the implanted impurity by thermal annealing so as to form a high impurity concentration layer and thermally oxidizing a surface of the high impurity concentration layer to form the thin silicon dioxide layer.

SUMMARY OF THE INVENTION

This invention relates to a method for forming a low barrier height oxide layer on the surface of a crystalline silicon substrate, comprising: (A) forming spaced field oxide regions on the surface of said crystalline silicon substrate, the space between said field oxide regions comprising a tunnel region; (B) vapor depositing a layer of amorphous silicon on the surface of said field oxide regions and on the surface of said substrate in said tunnel region, the thickness of said layer of amorphous silicon being in the range of about 50 Å to about 100 Å; and (C) oxidizing said layer of amorphous silicon. The oxidized amorphous silicon layer in said tunnel region is a tunnel oxide layer and, in one embodiment, the inventive method includes the step of (D) forming a floating gate over said tunnel oxide layer, said tunnel oxide layer having a barrier height of about 1.6 to about 2.0 eV.

BRIEF DESCRIPTION OF THE DRAWINGS

In the annexed drawings, like parts and features have like references.

FIG. 1 is a schematic cross-sectional illustration of a structure useful for making a non-volatile memory cell, the structure comprising a crystalline silicon substrate with field oxide regions formed on its surface.

FIG. 2 is the structure illustrated in FIG. 1 except that the structure further comprises an amorphous silicon layer overlying the surface of the overall structure, the amorphous silicon layer being oxidized during the inventive method, the portion of the oxidized amorphous silicon layer between the field oxide regions being a tunnel oxide layer.

FIG. 3 is the structure illustrated in FIG. 2 except that an amorphous silicon film overlies the surface of the overall structure, and a photoresist layer overlies the portion of the amorphous silicon film overlying the tunnel oxide layer and parts of the field oxide regions.

FIG. 4 is the structure illustrated in FIG. 3 except that the amorphous silicon film has been etched to form a floating gate, and the photoresist layer has been removed.

DETAILED DESCRIPTION OF THE PREFERRED EMBODIMENT(S)

The description of the preferred embodiment(s) will be provided with reference to the drawings. Referring to FIG. 1, spaced field oxide regions 102 are formed on silicon substrate (e.g., silicon wafer) 100. The substrate 100 is crystalline silicon substrate. The substrate 100 can have any thickness suitable for making a nonvolatile memory cell, with thicknesses in the range of about 500 to about 600 µm being typical. A core area 104 is located in the spaces between the field oxide regions 102. A tunnel region 106 is located in the core area 104 between the field oxide regions 102.

The field oxide regions 102 are formed using known techniques. In one embodiment, the field oxide regions 102 are formed by initially depositing a silicon nitride ($Si_3N_4$) film layer on the silicon substrate 100 to a thickness of about 1600 Å to about 1800 Å, and in one embodiment about 1700 Å. A photoresist layer is then deposited on the silicon nitride film layer. Examples of the photoresist materials that can be used include those available from Shipley or Shinetsu. A pattern covering the core area 104 is placed over the photoresist layer. The uncovered portions of the photoresist layer are then developed after exposing them to UV (ultra violet) light. The covered portions of the photoresist layer remain undeveloped.

The silicon nitride layer overlying the locations for the field oxide regions 102 is etched using known etching techniques. Examples of the etching materials that can be used include $CHF_3$ and $O_2$. Field oxide is grown in the locations for the field oxide regions 102 to a thickness of about 2500 Å to about 4000 Å, using dry oxidation at a temperature of about 1025° C. to about 1125° C. and atmospheric pressure.

Referring to FIG. 2, amorphous silicon layer 108 is formed by vapor depositing a layer of silicon on the surface of the overall structure. The silicon source can be $SiH_4$. The temperature used in the vapor deposition process is in the range of about 500° C. to about 550° C., and in one embodiment about 530° C. The pressure is in the range of about 0.3 Torr to about 0.5 Torr, and in one embodiment about 0.4 Torr. The amorphous silicon layer 108 has a thickness in the range of about 50 Å to about 100 Å, and in one embodiment about 60 Å to about 70 Å.

The amorphous silicon layer 108 is oxidized. In one embodiment, this oxidation is conducted using two oxidation steps. The first oxidation step involves contacting the amorphous silicon layer 108 with a gaseous mixture comprising oxygen and an inert gas. The inert gas can be argon or nitrogen with argon being preferred. In one embodiment, the inert gas is at a concentration of about 85% to about 95% by volume, and in one embodiment about 90% by volume, and the oxygen is at a concentration of about 5% to about 15% by volume, and in one embodiment about 10% by volume. The temperature is in the range of about 900° C. to about 1000° C., and in one embodiment about 950° C. The pressure is atmospheric. This first oxidation step is conducted for an effective period of time until about 80% to about 90%, and in one embodiment about 85%, of the amorphous silicon layer 108 has been oxidized. This oxidation step is typically conducted for about 5 to about 10 minutes, and in one embodiment about 8 minutes.

The second oxidation step is then conducted to oxidize all or substantially all of the remaining non-oxidized portion of the amorphous layer 108. In one embodiment about 100%, of the amorphous silicon layer 108 is oxidized by the combination of the first and second oxidation steps. The second oxidation step is sometimes referred to as self-limited oxidation step due to the fact that the oxidation is controlled so as to stop at the interface of amorphous silicon layer 108 and the silicon substrate 100. The second oxidation step involves contacting the oxidized amorphous silicon layer from the first oxidation step with a gaseous mixture comprising $N_2O$ and an inert gas. The inert gas can be argon or nitrogen with argon being preferred. In one embodiment, the inert gas is at a concentration of about 85% to about 95% by volume, and in one embodiment about 90% by volume; and the $N_2O$ is at a concentration of about 5% to about 15% by volume, and in one embodiment about 10% by volume. The temperature is in the range of about 800°C. to about 900° C., and in one embodiment about 850° C. The pressure is atmospheric. This second oxidation step is typically conducted for about 20 to about 30 minutes. The resulting oxidized amorphous silicon layer can be referred to as oxidized amorphous layer 110.

In an alternative embodiment, a thin layer of oxide is grown on the surface of the overall structure (i.e., substrate 100 and field oxide regions 102) prior to vapor depositing the amorphous silicon layer 108 on the surface of the overall structure. The amorphous silicon layer 108 is then vapor deposited on this thin layer of oxide and thereafter oxidized in the same manner as described above. This thin layer oxide has a thickness of about 10 Å to about 20 Å, and in one embodiment about 15 Å. This thin layer of oxide is grown using known techniques. For example, this thin layer of oxide is grown by contacting the surface of the overall structure with gaseous mixture containing: about 90% to about 95% by volume argon and about 5% to about 10% by volume oxygen. Nitrogen can be used in place of the argon. The temperature is in the range of about 800° C. to about 900° C., and in one embodiment about 850° C. The pressure is atmospheric. This alternative embodiment provides for the advantage of using a stack of two different tunnel oxides with improved interface state density.

Referring to FIG. 3, an amorphous silicon film 112 is formed on the overall surface of the structure overlaying the oxidized amorphous layer 110. The amorphous silicon film 112 has a thickness of about 800 Å to about 1000 Å, and in one embodiment to about 900 Å. The amorphous silicon film 112 can be formed using known techniques. In one embodiment, the amorphous silicon film 112 is doped. In one embodiment, doped amorphous silicon film 112 is formed by vapor depositing $SiH_4$ and $PH_3$ on the surface of the structure at a temperature of about 530° C., and a pressure of about 0.4 Torr.

A photoresist layer 114 is formed on the amorphous silicon film 112 over the core area 104. The photoresist material can be any photoresist material known in the art. Examples include those available from Shipley or Shinetsu. The photoresist layer 114 is spun on the surface of the film 112 using known techniques. A pattern is then placed over the photoresist material. The photoresist material is developed in the core area. Photoresist layer 114 has a thickness in the range of about 8000 Å to about 10000 Å.

The amorphous silicon film 112 in the area not protected by photoresist layer 114 is etched. The etching material can be any etching material known in the art. Examples include gaseous mixtures of $Cl_2$ and $SF_6$. This etching process results in the formation of floating gate 116 in core area 104 which is depicted in FIG. 4. Floating gate 116 is made of the amorphous silicon deposited as film layer 112. The photoresist layer 114 is then removed using known procedures.

Thereafter, the desired non-volatile memory cell can be built using conventional procedures. These procedures include, for example, the construction of gate structures and the implantation of dopants, preceded by the application of specialized masks, and followed by the removal of such masks, all of such procedures being known to those skilled in the art. An advantage of such a non-volatile memory cell is that it has a barrier height for the tunnel oxide layer of about 1.6 to about 2.0 eV, and in one embodiment about 1.8 eV.

INDUSTRIAL APPLICABILITY

This invention relates to an improved process for making non-volatile memory cells. The structure disclosed herein is useful in making non-volatile memory cells having low barrier height tunnel oxides which are suitable for low voltage applications. These memory cells are useful in making erasable programmable read only memories (EPROMS), electrically erasable programmable read only memories (EEPROMS), Flash EPROMS, and Flash EEPROMS. They are particularly suitable for low-voltage, low-power applications such as battery-operated wireless digital hand-held telephones.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A method for forming a low barrier height oxide layer on the surface of a crystalline silicon substrate, comprising:

(A) forming spaced field oxide regions on the surface of said crystalline silicon substrate, the space between said field oxide regions comprising a tunnel region;

(B) vapor depositing a layer of amorphous silicon on the surface of said field oxide regions and on the surface of said substrate in said tunnel region, the thickness of said layer of amorphous silicon being in the range of about 50 Å to about 100 Å; and (C) oxidizing said layer of amorphous silicon using two oxidation steps, the first step comprising contacting said layer of amorphous silicon with a gaseous mixture comprising oxygen and an inert gas to oxidize a portion of said amorphous silicon, the second step comprising contacting the oxidized amorphous silicon layer with a gaseous mixture comprising N₂O and an inert gas to oxidize the remaining portion of said amorphous silicon.

2. The method of claim 1 wherein subsequent to step (A) but prior to step (B) a thin layer of oxide having a thickness of about 10 Å to about 20 Å is grown on the surface of said field oxide regions and on the surface of said substrate in said tunnel region.

3. The method of claim 1 wherein about 100% of said layer of amorphous silicon is oxidized during step (C).

4. The method of claim 1 wherein said vapor depositing step (B) is conducted at a temperature of about 500° C. to about 550° C.

5. The method of claim 1 wherein said vapor depositing step (B) is conducted at a pressure in the range of about 0.3 to about 0.5 Torr.

6. The method of claim 1 wherein the source of silicon for said layer of amorphous silicon is SiH₄.

7. The method of claim 1 wherein said first oxidation sep comprises contacting the amorphous silicon layer deposited during step (B) with a gaseous mixture comprising oxygen and an inert gas at a temperature of about 900° C. to about 1000° C. for an effective period of time to oxidize about 80% to about 90% of said layer of amorphous silicon; and the second oxidation step comprises contacting the oxidized amorphous layer from said first oxidation step with a gaseous mixture comprising N₂O and an inert gas at a temperature of about 800° C. to about 900° C.

8. A method for forming a low barrier height oxide layer on the surface of a crystalline silicon substrate, comprising:

(A) forming spaced field oxide regions on the surface of said crystalline silicon substrate, the space between said field oxide regions comprising a tunnel region;

(B) vapor depositing a layer of amorphous silicon on the surface of said field oxide regions and on the surface of said substrate in said tunnel region, the thickness of said layer of amorphous silicon being in the range of about 50 Å to about 100 Å; and (C) oxidizing said layer of amorphous silicon using two oxidation steps, the first step comprising contacting said layer of amorphous silicon with a gaseous mixture comprising oxygen and an inert gas to oxidize a portion of said amorphous silicon, the second step comprising contacting the oxidized amorphous silicon layer with a gaseous mixture comprising N₂O and an inert gas to oxidize the remaining portion of said amorphous silicon, the oxidized amorphous silicon layer in said tunnel region comprising a tunnel oxide layer; and (D) forming a floating gate over said tunnel oxide layer, said tunnel oxide layer having a barrier height in the range of about 1.6 to about 2.0 eV.

* * * * *